United States Patent [19]

Loper et al.

[11] Patent Number: 5,604,929
[45] Date of Patent: Feb. 18, 1997

[54] SYSTEM FOR CORRECTING QUADRATURE GAIN AND PHASE ERRORS IN A DIRECT CONVERSION SINGLE SIDEBAND RECEIVER INDEPENDENT OF THE CHARACTER OF THE MODULATED SIGNAL

[75] Inventors: Roger K. Loper, Marion; Thomas R. Hope; Charles S. Farlow, both of Cedar Rapids, all of Iowa

[73] Assignee: Rockwell International, Seal Beach, Calif.

[21] Appl. No.: 426,315

[22] Filed: Apr. 21, 1995

[51] Int. Cl.⁶ .................................... H04B 1/26
[52] U.S. Cl. ............... 455/324; 455/245.1; 455/303; 329/308; 329/349; 375/261; 375/345
[58] Field of Search .................... 455/324, 303, 455/306, 305, 296, 304, 313, 314, 245.1, 232.1; 375/261, 344, 345, 349, 350; 329/308, 309, 349, 350

[56] References Cited

U.S. PATENT DOCUMENTS

| 3,970,946 | 1/1976 | Matsuo | 329/104 |
|---|---|---|---|
| 5,095,536 | 3/1992 | Loper | 455/324 |
| 5,179,730 | 1/1993 | Loper | 455/266 |
| 5,230,099 | 7/1993 | Loper | 455/324 |
| 5,249,203 | 9/1993 | Loper | 375/97 |
| 5,406,587 | 4/1995 | Horwitz et al. | 375/346 |

*Primary Examiner*—Reinhard J. Eisenzopf
*Assistant Examiner*—Lee Nguyen
*Attorney, Agent, or Firm*—Kyle Eppele; M. Lee Murrah; George A. Montanye

[57] ABSTRACT

A system connecting and controlling gain and phase errors in a direct conversion receiver having a pair of signal channels carrying I and Q baseband signal components in a quadrature relationship. The system operates by treating all phase and gain errors as resident in the Q channel and thus describes an iterative process generating a plurality of intermediary signals that in turn incorporate a trigonometric product of the IF signal and the I and Q signal component to produce a pair of correction factors that ideally maintains a matched quadrature relationship between the two signal channels.

2 Claims, 4 Drawing Sheets

SYSTEM FOR CORRECTING QUADRATURE GAIN AND PHASE ERRORS IN A DIRECT CONVERSION SINGLE SIDEBAND RECEIVER INDEPENDENT OF THE CHARACTER OF THE MODULATED SIGNAL

FIELD OF THE INVENTION

The present invention relates generally to amplitude modulated (AM) radio receivers and, more particularly, to arrangements and methods of demodulating AM signals in a direct conversion radio receiver.

BACKGROUND OF THE INVENTION

There are an increasing number of radio applications requiring communication over a wide frequency spectrum, for example, 30 to 400 megahertz. Radios having circuitry which performs conversion of the received AM signal directly to the audio signal, without first mixing down to an intermediate frequency ("IF"), are commonly referred to as direct conversion, or zero-IF receivers.

In a typical IQ direct conversion receiver, incoming RF communication signals are split into a pair of equal amplitude components which are in phase with each other. These RF components are then mixed with separate injection signals at approximately the same frequency as the communications signal but which are 90° out-of-phase with each other. I and Q baseband signal components which are in quadrature are thereby generated. These signals are then independently filtered and amplified at audio frequencies on separate signal channels. The I and Q components formed as a result of the mixing process allow the signal to be conveniently demodulated upon being supplied to a suitable signal processing unit.

This architecture works well except that it is very difficult to achieve and maintain identical gain and exact phase quadrature between the signal channels and variations between the signal channels which commonly occur as a result of changes in temperature, frequency and other operational parameters result in gain and phase mismatches which produce distortion products in the output receiver. Gain mismatches of as little as 0.2 dB and phase mismatches of as little as 1° can result in distortion products which can not ordinarily be reduced to less than 30 to 40 dB in practice and correspond to discrete tones which greatly limit the performance of the receiver.

Various solutions to the problems are well known in the prior art based upon the generation of new quadrature and phase signals independent of amplitude effects. By then approximating DC components for I and Q, the original I and Q baseband signals are corrected for gain and phase errors between the signal channels. An example of such technical solution is set forth in U.S. Pat. No. 5,230,099, incorporated herein by reference.

Unfortunately, the prior art solutions to improving direct conversion receiver processing are ineffective in processing single side band suppressed carrier signals. While the prior art double sideband suppressed carrier signal solutions are relatively simple, a need exists for similar discoveries applicable to single sideband situations.

SUMMARY OF THE INVENTION

The present invention constitutes a system for controlling gain and phase errors resulting from mis-matches between signal channels in a direct conversion receiver having a pair of signal channels adapted for processing I and Q baseband signal components, of a single sideband suppressed carrier signal. In accordance with the system of the present invention all phase and gain distortion is treated as though it exists in the Q baseband signal. A first set of intermediary signals are generated that are subsequently filtered and utilized to generate a second set of intermediary signals that are then used to determine a pair of correction coefficient factors applied to the I and Q signal values to obtain the modified Q signal value free of the phase and gain error.

In one embodiment, the invention is implemented in a direct conversion receiver as a signal processing algorithm resident within a digital signal processing system coupled for receiving digitized I and Q baseband component signals. Three intermediary signals A, B, and C are generated dependent upon algebraic relationship between the I and Q signal values. Correction coefficients are derived from the values of the three intermediary signals and in turn are utilized in determining a modified Q signal in accordance with the following, $Q_c=k1Q+k2I$. In subsequent iterations the values of the two correction factors are updated to represent the most recent iteration value.

It is an object of the present invention to provide a direct conversion receiver configured to process single sideband carrier signals.

It is a feature of the present invention to utilize a digital processor correction unit for maintaining a true quadrature relationship between the I and Q baseband signals.

It is an advantage of the present invention that the single sideband carrier signal processing system can be implemented consistent with current direct conversion receiver architectures.

These and other objects, features and advantages are disclosed and claimed in the specification, figures and claims of the present application.

DESCRIPTION OF THE PREFERRED EMBODIMENT

Figure 1:
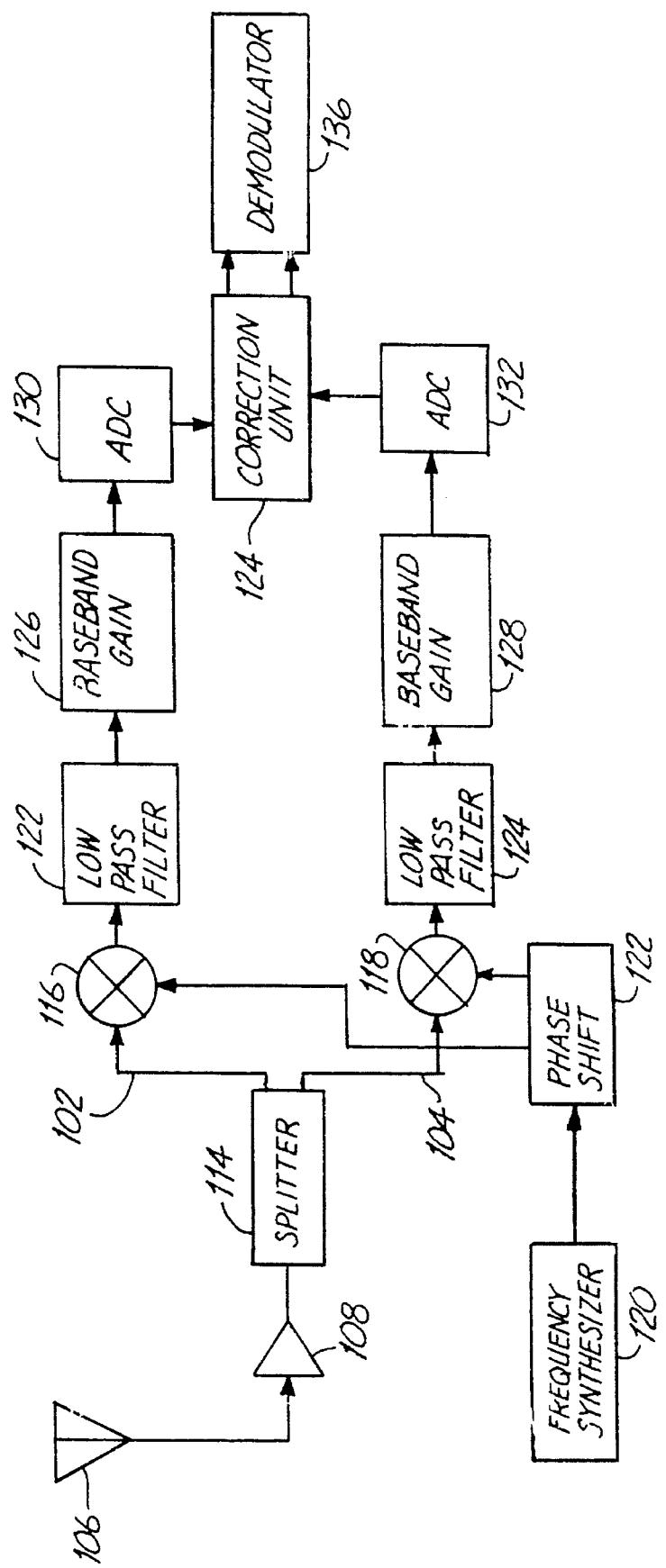
FIG. 1 illustrates a block diagram of a direct conversion receiver including a correction unit in accordance with the present invention.

Referring now to the drawings, wherein like items are referenced as such throughout, FIG. 1 illustrates a direct conversion radio receiver 100 having two baseband channels 102 and 104 for processing baseband signal components I and Q. Signals I and Q are stated to have a quadrature relationship. The receiver 100 includes a correction unit 134 for controlling phase and gain errors resulting from hardware mismatches between the signal channels. Reviewing the structure and operation of the radio receiver 100, radio frequency ("RF") signals picked up by an antenna 106 are supplied to a preamplifier 108 which provides a limited amount of RF gain. An output signal of the preamplifier 108 is passed to a signal splitter 114 which divides the signal into equal amplitude and inphase RF signal components which are then routed to a pair of mixers 116, 118. A frequency synthesizer 120 generates an injection signal on frequency with a desired communications signal. The injection signal from the synthesizer 120 is coupled to a phase shifting component 122 which splits the injection signal into equal amplitude quadrature components which are subsequently coupled to the mixers 116, 118.

The mixers 116, 118 generate an I and Q baseband component signal, respectively, as a product of the interaction of the signals received from the phase shifting component 122 and the RF signal components from the signal splitter 114. The baseband signal channels 102 and 104 include separate lowpass filters 122 and 124 which provide for selectivity for the receiver 100 and separate baseband amplifiers 126 and 128 which are the primary source of gain for the receiver 100. After being selected and amplified, the baseband signal components I and Q are supplied to a pair of analog-to-digital converters ("ADC") 130 and 132, which convert the I and Q baseband component signals to digitized format.

The digitized I and Q baseband signal components are coupled to a correction unit 134. The correction unit 134 processes the digital I and Q signals in order to detect any phase or gain errors between the signal channels. Upon detection of phase or gain differences in the I and Q signals, the correction unit 134 adjust the relationship between the I and Q signals, correcting for such errors. The corrected I and Q baseband signals are subsequently coupled to a demodulator 136 which extracts the data impressed upon the signals and provides a corresponding audio output signal.

Figure 2:
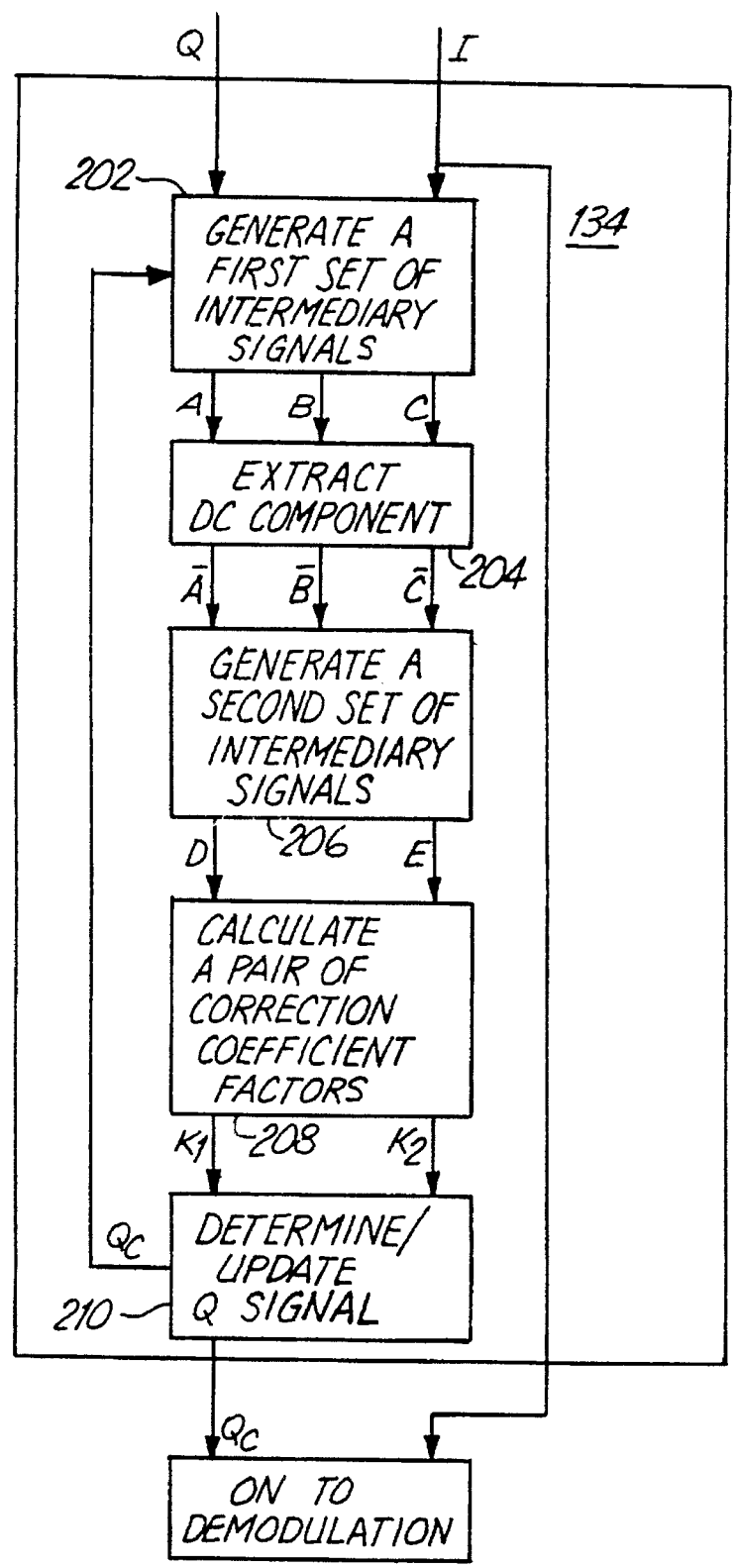
FIG. 2 illustrates a high level block diagram of the correction unit of FIG. 1.

Referring now to FIG. 2, the correction unit 134 of the present invention is shown in greater detail. The correction unit 134 includes modules 202, 204, 206 and 208 which detect phase and gain errors between the signal channels 104 and 102, and module 210 which adjusts the relationship between the I and Q signals by modifying the Q signal in order to produce a corrected Q baseband signal dependent upon correction factors. It should be understood that the correction unit 134 preferably constitutes a logic device, such as a processor configured for such application. It would similarly be understood that the modules 204, 206, 208 and 210 would be implemented in software routines which provide the signal processing functions described herein.

The module 202 receives the input signal components I and Q while generating three intermediary signals, A, B and C. The intermediary signals A, B, and C each have their DC component value extracted, thereby yielding three resultant signals designated $\overline{A}$, $\overline{B}$, and $\overline{C}$. The three resultant signals representative of the gain and phase errors are used to create a second set of intermediary signals D and E. Two correction coefficients are then determined based upon algebraic relationships of D and E. The above process is repeated with additional considerations for past determinations of the Q signal value and the correction coefficients. A modified Q channel signal $Q_c$ is determined according to the equation: $Q_c = k1Q + k2I$, where $XQ_c$ and I are the output signals of module 204; k1=1/(1+gain error value) (cos(phase error value)); k2=tan (phase error value).

Figure 3:
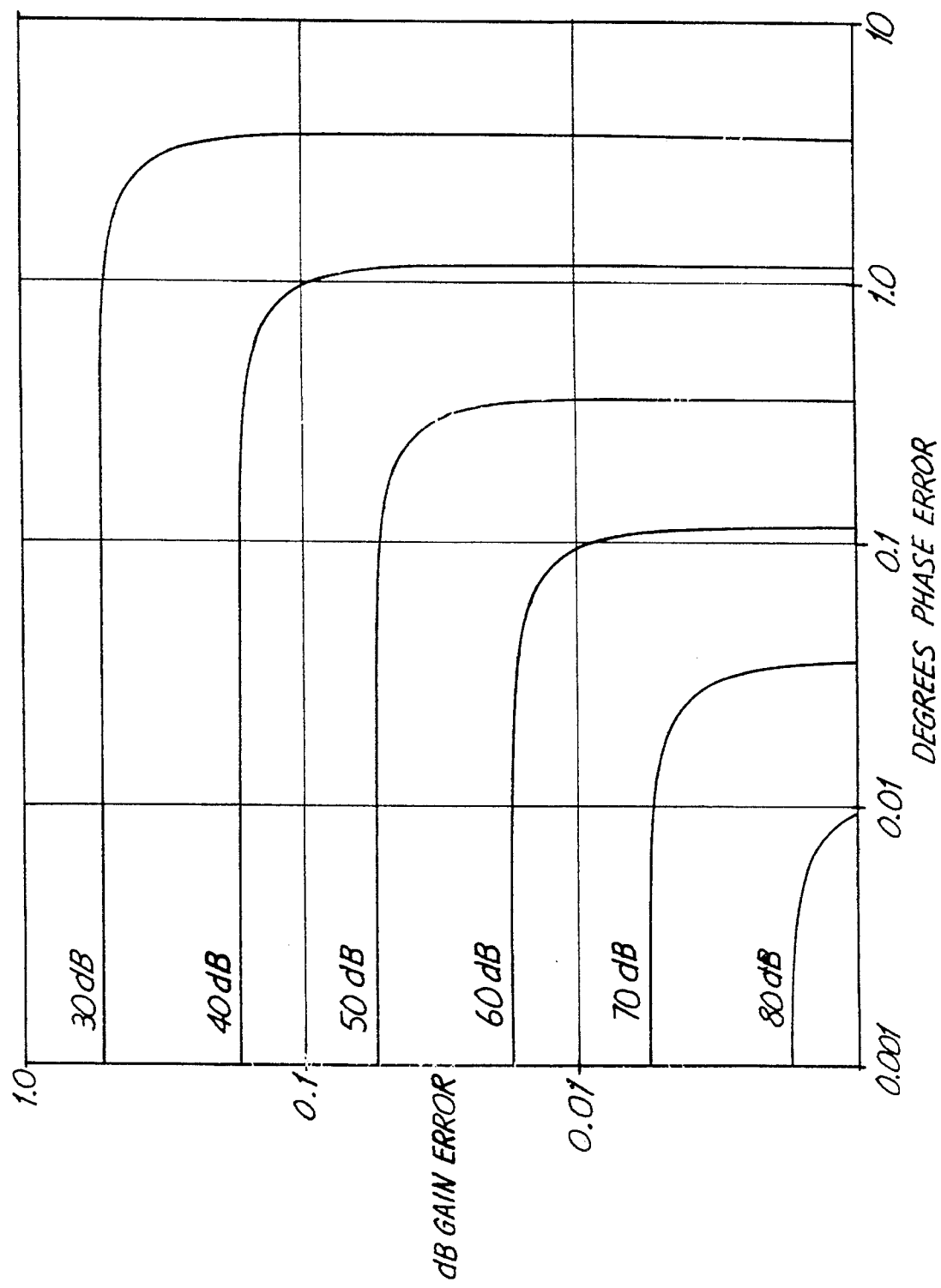
FIG. 3 illustrates a two dimensional graphical depiction of the relationship between sideband suppression and gain and phase error.

Referring now to FIG. 3, a two dimensional graphical representation showing sideband suppression as a function of quadrature gain and phase errors. It can be seen that the common requirement of 60 dB suppression of the unwanted sideband requires quadrature accuracy of approximately 0.1 degree and 0.01 dB.

Figure 4:
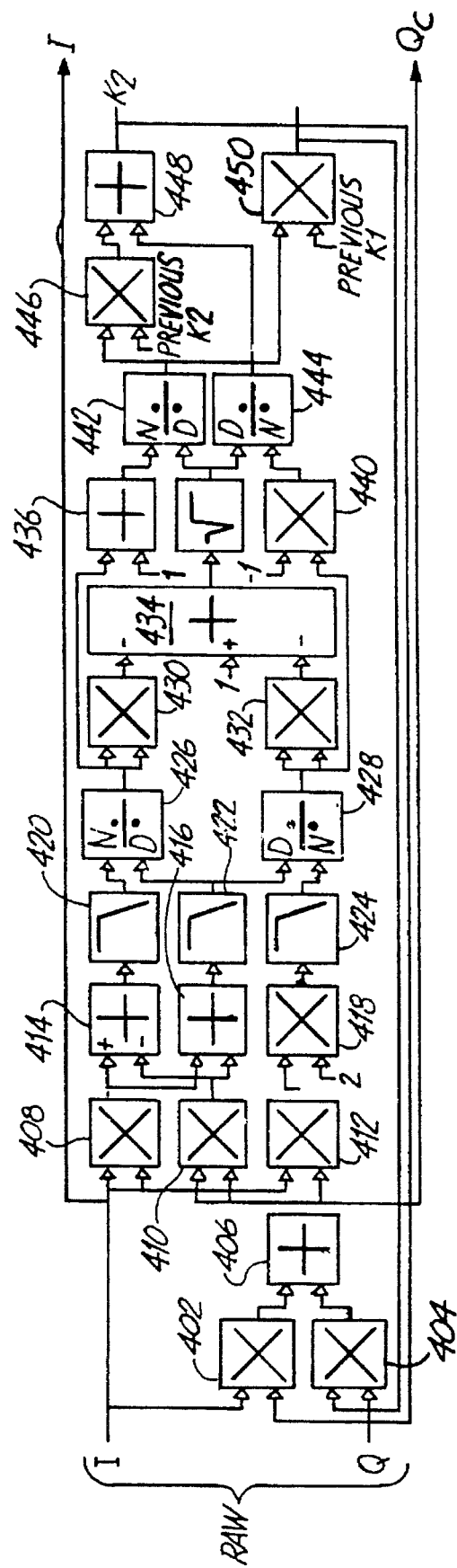
FIG. 4 illustrates a flow chart of a digital signal processing algorithm in accordance with the present invention for detecting gain and phase errors and adjusting such errors in single side band suppressed carrier signals.

Referring now to FIG. 4, a flow chart is shown for a correction unit 130 which controls gain and phase angles between the signals in channels 105 and 110 by iterative calculating the gain and phase errors so that progressively improving adjustments may be made to the baseband signals I and $Q_c$ in producing the corrected baseband signal components I and $Q_c$. Adjustments are made to the quadrature baseband component Q in steps 402, 404 and 406 whereby a corrected quadrature baseband component signal $Q_c$ is generated for supply to the demodulator and for use in steps 408 through 450 which represent the beginning steps in calculating the phase and gain error. In accordance with the steps of 410–412, the I signal component value is squared, the Q signal component value is squared and the value of I and Q are multiplied, yielding the values $I^2$, $Q^2$, and IQ respectively. Steps 414–418 yield three intermediary signals A, B, and C by utilizing the derived values of Steps 408-412 in accordance with the following relationships:

Step 414; $I^2 - Q^2 = A$

Step 416; $I^2 + Q^2 = C$ step 418; $2IQ = B$

Next, in Steps 420–424, the three intermediary signals are low-pass filtered to extract any DC signal value, thereby providing resultant signals $\overline{A}$, $\overline{B}$, and $\overline{C}$. The resultant signals from Step 420, $\overline{A}$ is divided by the resultant signal from Step 422, $\overline{C}$, there yielding D, as shown in Step 426. Similarly, the resultant signal of Step 424, $\overline{B}$ is divided by $\overline{C}$ in Step 428, thereby yielding E.

In Step 430, the output signal value D is squared and coupled to Step 434, where its value is reversed in magnitude. In a similar fashion the output signal value of Step 428 is squared in Step 432 and inversed in magnitude in Step 434. Step 434 includes an additional input signal value of 1 thereby yielding the quantity $(1-D^2-E^2)$.

Turning now to Step 436, the value of the output signal of Step 426, D, is combined with an additional input signal having a value of one. Similarly, in Step 440 the value E is multiplied by a negative unit value, thereby yielding −E. Finally, Step 438 performs the square root operation on the value $(1-D^2-E^2)$.

In Step 442 correction coefficient k1 is determined utilizing the output signals of Steps 436 and 438 in accordance with the following relationship:

$k1 = (1+D)/(1-D^2-E^2)^{1/2}$

Similarly, the operation of Step 444, provides the value for the second coefficient correction factor k2, relying upon the output values of Steps 440 and 438 with the following relationship:

$k2 = -E/(1-D^2-E^2)^{1/2}$

Although the above mathematical expressions for correction coefficient factors k1 and k2 represent precise values, limitations in computational precision in any actual implementation of the above steps, could make iterative calculations desirable. If the above process is run iteratively the determination of $Q_c$, as set forth in the description of FIG. 2, Becomes: $Q_c = (k1) Q_c + (k2)I$, Where $Q_c$=the new interative value Where $Q_c$=the previous interative value.

The calculated values of correction coefficients k1 and k2, Steps 442, 444 are incremental constants that represent the residual gain and phase errors from the previous iteration and are represented by the symbols k1inc(N) and k2inc(N). The incremental correction coefficient values must then be combined with the previous values for k1 and k2 used in the previous iteration in order to obtain updated values for k1 and k2. The correction coefficient factors k1 and k2 for the (N+1)th iteration of the above process are designated $k1_{N+1}$ and $k2_{N+2}$. Step 450 illustrates the determination of an updated k1 value in accordance with the following equation:

$$k1_{N+1}=(k1\text{inc}_{(N)})(k1_N)$$

The determination of an updated value for k2 is set forth in Steps 446 and 448 in accordance with the following equation:

$$k2_{N+1}=(k2_N)(k1\text{inc}_{(N)})+k2\text{inc}_{(N)}$$

The desired values of Steps 448 and 450 are subsequently utilized in Steps 402–406, thereby implementing the relationship given by:

$$Q_c=(k1)Q+(k2)I,$$

The resulting signal value of Step 450 is coupled to Step 448 and is multiplied by a factor of two with the product value coupled to Step 444 for summation with the value of one. The resulting signal value of Step 444 is coupled to Steps 436 and 438. In Step 436 the resulting signal value of Step 444 is multiplied by the immediate previous value of the correction factor k2, while in Step 438 a similar process occurs with the immediate previous value of k1 substituted for k2. The signal value representing the product of Step 436 is coupled to Step 428 where the DC component for the Q component is subtracted and a "new" value is established for k2. Step 438 yields a new value for k1. The new value of k1 is coupled to Step 404, while the new value of k2 is coupled to Step 402 and the entire process repeats.

While particular embodiments of the present invention have been shown and described, it should be clear that changes and modifications may be made to such embodiments without departing from the true spirit of the invention. It is intended that the appended claims cover all such changes and modifications.

I claim:

1. A method for controlling phase and gain errors in a direct conversion receiver having a pair of signal channels carrying baseband signal components I and Q which are in approximate quadrature comprising:

generating a first set of three intermediary signals based upon the baseband signal components, wherein the three intermediary signals are denoted as A, B, C and are derived in accordance with the following relationships:

$$A=I^2-Q^2.$$

$$B=2IQ$$

$$C=I^2+Q^2;$$

filtering the DC component from each intermediary signal of the first set of intermediary signals;

generating a second set of two intermediary signals based upon the first set of intermediary signals; wherein the second set of intermediary signals are denoted as D, E and are derived in accordance with the following relationships:

$$D=\bar{A}|\bar{C};$$

$$E=\bar{B}|\bar{C};$$

where $\bar{A}$, $\bar{B}$, $\bar{C}$ represent the filtered first set of intermediary signals:

determining a pair of correction coefficient factors based upon the second set of intermediary signals k1, k2, Initially determined in accordance with the following relationships:

$$k1=(1+D)/(1-D^2-E^2)^{1/2}$$

$$k2=-E/(1-D^2-E^2)^{1/2};$$

and determining a modified signal value for one of the baseband signal components based upon correction coefficient factors that adjusts for the phase and gain error between the baseband signal components.

2. The method of claim 1, wherein the pair of correction coefficient factors k1, k2 are iteratively determined in accordance with the following relationships:

$$k1_{N+1}=(k1\text{ inc}_{(N)})+(k1N);$$

$$k2_{N+1}=(k2N)(k1\text{inc}_{(N)})+k2\text{inc}_{(N)};$$

where, $k1\text{inc}_{(N)}$ and $k_2\text{inc}_{(N)}$ equal the incremental correction coefficient factor values for the n iteration of the relationships of claim 1.

\* \* \* \* \*